US011313910B2

(12) United States Patent
Isa et al.

(10) Patent No.: US 11,313,910 B2
(45) Date of Patent: Apr. 26, 2022

(54) ANOMALY DETECTION SYSTEM AND ANOMALY DETECTION METHOD FOR A SECONDARY BATTERY

(71) Applicant: SEMICONDUCTOR ENERGY LABORATORY CO., LTD., Atsugi (JP)

(72) Inventors: Toshiyuki Isa, Kanagawa (JP); Koji Kusunoki, Kanagawa (JP); Akihiro Chida, Kanagawa (JP); Kouhei Toyotaka, Kanagawa (JP); Ryota Tajima, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 92 days.

(21) Appl. No.: 16/645,980

(22) PCT Filed: Sep. 5, 2018

(86) PCT No.: PCT/IB2018/056755
§ 371 (c)(1),
(2) Date: Mar. 10, 2020

(87) PCT Pub. No.: WO2019/053557
PCT Pub. Date: Mar. 21, 2019

(65) Prior Publication Data
US 2020/0278398 A1   Sep. 3, 2020

(30) Foreign Application Priority Data

Sep. 14, 2017 (JP) .............................. JP2017-176642

(51) Int. Cl.
G01R 31/367 (2019.01)
G01R 31/3842 (2019.01)
(Continued)

(52) U.S. Cl.
CPC ......... G01R 31/367 (2019.01); G01R 31/389 (2019.01); G01R 31/3842 (2019.01); H01M 10/0525 (2013.01)

(58) Field of Classification Search
CPC   G01R 31/367; G01R 31/389; G01R 31/3842; H01M 10/0525; H01M 10/4257;
(Continued)

(56) References Cited

U.S. PATENT DOCUMENTS 7,764,049 B2   7/2010   Iwane et al.
8,271,421 B1   9/2012   Garvey
(Continued)

FOREIGN PATENT DOCUMENTS

CN   101351720 A   1/2009
CN   107250824 A   10/2017
(Continued)

OTHER PUBLICATIONS

International Search Report (Application No. PCT/IB2018/056755) dated Dec. 11, 2018.
(Continued)

*Primary Examiner* — Vuthe Siek
(74) *Attorney, Agent, or Firm* — Nixon Peabody LLP; Jeffrey L. Costellia

(57) ABSTRACT

An anomaly detection system for a secondary battery which detects the remaining capacity of the secondary battery on an electric vehicle, cautions against the secondary battery with anomalous characteristics, stops using the secondary battery, changes the secondary battery, or changes charging conditions of the secondary battery is provided. The anomaly detection system is provided; the system compares a value obtained by estimating internal resistance or SOC of a secondary battery based on the measured value of a current or a voltage of the secondary battery with the use of a
(Continued)

nonlinear Kalman filter and a value input to an anomaly detection system (network) of AI to predict a change in the internal resistance; the system regards a case where the difference is large as an anomaly; and the system detects an anomaly.

3 Claims, 6 Drawing Sheets

(51) Int. Cl.
    *G01R 31/389* (2019.01)
    *H01M 10/0525* (2010.01)
    *H01M 10/42* (2006.01)

(58) Field of Classification Search
    CPC ....... H01M 10/425; H01M 2010/4278; H01M 10/42; G06N 3/04
    See application file for complete search history.

(56) References Cited

U.S. PATENT DOCUMENTS

| | | |
|---|---|---|
| 8,548,749 B1 | 10/2013 | Garvey |
| 8,548,750 B1 | 10/2013 | Garvey |
| 8,849,586 B1 | 9/2014 | Garvey |
| 8,855,954 B1 | 10/2014 | Bickford et al. |
| 9,329,240 B2 | 5/2016 | Baba et al. |
| 2006/0181245 A1 | 8/2006 | Mizuno et al. |
| 2009/0027007 A1 | 1/2009 | Iwane et al. |
| 2013/0297243 A1 | 11/2013 | Baba et al. |
| 2014/0244225 A1* | 8/2014 | Balasingam ....... G01R 31/3842 703/2 |
| 2018/0024200 A1 | 1/2018 | Hiwa |
| 2020/0153264 A1 | 5/2020 | Osada et al. |

FOREIGN PATENT DOCUMENTS

| | | |
|---|---|---|
| EP | 1972956 A | 9/2008 |
| EP | 2667211 A | 11/2013 |
| JP | 2007-187534 A | 7/2007 |
| JP | 2012-057964 A | 3/2012 |
| JP | 2015-184219 A | 10/2015 |
| WO | WO-2007/080802 | 7/2007 |
| WO | WO-2016/129248 | 8/2016 |
| WO | WO-2018/203170 | 11/2018 |

OTHER PUBLICATIONS

Written Opinion (Application No. PCT/IB2018/056755) dated Dec. 11, 2018.

* cited by examiner

ANOMALY DETECTION SYSTEM AND ANOMALY DETECTION METHOD FOR A SECONDARY BATTERY

TECHNICAL FIELD

One embodiment of the present invention relates to an object, a method, or a manufacturing method. The present invention relates to a process, a machine, manufacture, or a composition of matter. One embodiment of the present invention relates to a manufacturing method of a semiconductor device, a display device, a light-emitting device, a power storage device, a lighting device, or an electronic device. In particular, the present invention relates to a method for estimating capacity of a power storage device and an anomaly detection system.

In this specification, the power storage device is a collective term describing units and devices having a power storage function. For example, the power storage device includes a storage battery (also referred to as a secondary battery) such as a lithium-ion secondary battery, a lithium-ion capacitor, a nickel hydrogen battery, an all-solid battery, an electric double layer capacitor.

One embodiment of the present invention relates to a neural network and a charging control system using the neural network. One embodiment of the present invention relates to vehicles using a neural network. One embodiment of the present invention is not limited to vehicles, and can also be applied to a power storage device for storing electric power obtained from power generation facilities such as a solar power generation panel provided in a structure body. One embodiment of the present invention relates to an electronic device using a neural network. One embodiment of the present invention relates to an anomaly detection system using a neural network.

BACKGROUND ART

In recent years, a variety of power storage devices such as lithium-ion secondary batteries, lithium-ion capacitors, and air batteries have been actively developed. In particular, demand for lithium-ion secondary batteries with high output and high energy density has rapidly grown with the development of the semiconductor industry; the lithium-ion secondary batteries are essential as rechargeable energy supply sources for today's information society. Lithium-ion secondary batteries have been applied to portable information terminals such as mobile phones, smartphones, tablets, and laptop computers; gaming consoles; portable music players; digital cameras; medical equipment; and next-generation clean energy vehicles such as hybrid electric vehicles (HEVs), electric vehicles (EVs), and plug-in hybrid electric vehicles (PHEVs).

Electric vehicles are vehicles in which only an electric motor is used for a driving portion, and hybrid vehicles are vehicles having both an internal-combustion engine such as an engine and an electric motor. A plurality of battery packs having a plurality of secondary batteries are provided on the lower side of an electric vehicle and a hybrid vehicle.

The secondary battery used in an electric vehicle or a hybrid electric vehicle degrades due to the number of charging, depth of discharge, charge current, charging environment (temperature change), or the like. The degradation also depends on the usage of the user, and charging temperatures, frequency of quick charging, the charging amount with a regenerative brake, the charging timing with the regenerative brake, and the like might be related to the degradation. An anomaly such as a short circuit may occur in the secondary battery used in the electric vehicle or the hybrid electric vehicle due to degradation over time or the like.

The secondary battery used for the electric vehicle or the hybrid electric vehicle is expected to be highly reliable because it is assumed to be used for a long time.

Patent Document 1 discloses an example where a neural network is used for calculating the remaining capacity of a secondary battery.

REFERENCES

Patent Documents

[Patent Document 1] U.S. Published Patent Application No. 2006/0181245

SUMMARY OF THE INVENTION

Problems to be Solved by the Invention

An anomaly of the secondary battery is detected and the safety is secured through predicting events which may harm safety of the secondary battery, cautioning to the user, and changing operating conditions of the secondary battery.

Electric vehicles with secondary batteries are required to show precisely the information on the remaining capacity, that is, the distance through which the electric vehicles can drive. An anomaly of a secondary battery which might stop a function of the secondary battery suddenly occurs in some cases, though it does not occur many times, and it is difficult to predict the anomaly in conventional ways. One embodiment of the present invention provides a control system for a secondary battery which calculates the remaining capacity and the internal resistance of the secondary battery on the electric vehicles, cautions against the secondary battery with anomalous characteristics, stops using the secondary battery, changes the secondary battery, or changes charging conditions of the secondary battery.

An object of one embodiment of the present invention is to provide a novel battery control circuit, a novel power storage device, a novel electronic device, and the like.

Note that the objects of one embodiment of the present invention are not limited to the objects listed above. The objects listed above does not preclude the existence of other objects. The other objects are objects that are not described in this section and will be described below. The objects that are not described in this section will be derived from the description of the specification, the drawings, and the like and can be extracted from the description by those skilled in the art. One embodiment of the present invention is to solve at least one object of the descriptions listed above and/or the other objects.

Means for Solving the Problems

Degradation of a secondary battery increases the internal resistance. The degree of degradation of the secondary battery can be determined from the internal resistance. Note that a resistance component of an internal impedance is referred to as an internal resistance.

In the lithium-ion battery, only parameters of a current, a voltage, and a temperature can be measured, and it is difficult to measure the internal resistance and the SOC (State Of Charge) directly. A nonlinear Kalman filter is employed to estimate the internal resistance and the SOC, the estimated result is input into the AI (Artificial Intelligence) system with the measured values of the current and the voltage to predict the change of the internal resistance, and determination of anomaly is performed. For example, when the difference between the internal resistance obtained through the nonlinear Kalman filter and the internal resistance estimated by LSTM (Long Short-Term Memory) is large, it is possible to determine that an anomaly occurs.

The nonlinear Kalman filter, specifically, an unscented Kalman filter (UKF) can be used to estimate the internal resistance and the SOC of the secondary battery. An extended Kalman filter (EKF) can also be used.

The structure of the invention disclosed in this specification is an anomaly detection system; the system includes a neural network, a secondary battery, a detection method for detecting the current and the voltage of the secondary battery; the neural network includes an input layer, an output layer, and one or a plurality of hidden layers between the input layer and the output layer; the system calculates an estimated value of internal parameters using data of the current and voltage with the nonlinear Kalman filter; the estimated value of the internal parameter is input to the neural network; the neural network outputs a predicted value in the future, that is, the value after a certain period of time passed, compares the past predicted value of the internal parameters and the present estimated value of the internal parameters; and when the difference is large, it is regarded as an anomaly of the secondary battery.

In addition, a neural network may be used to predict the degree of battery degradation. The usage environment of electric vehicles and portable information terminals changes over time, and parameters of a battery are changed by that; thus, estimation and prediction are difficult. The use of a neural network can increase accuracy. In the case where learning is performed in the structure of the invention disclosed in this specification, only normal values are used as teaching data; thus, the need of anomalous data collection can be cut out. In the case where an anomaly occurs in a battery and the battery is short-circuited, it is impossible to collect anomalous data from the short-circuited secondary battery; accordingly, the anomalous data is collected during the period after an occurrence of a micro-short circuit and before the battery is short-circuited, and thus it is difficult to collect the anomalous data. In the case where learning is performed in the structure of the invention disclosed in this specification, it is very advantageous that anomalous data is unnecessary. If a very rare anomaly occurs in a secondary battery, the anomaly can be detected. In addition, if an unknown anomaly occurs in a secondary battery, the anomaly can be detected. Since anomalous data is unnecessary, the amount of data for learning can be smaller, and arithmetic operation is not complicated; thus, a microcomputer which can output a result in a few seconds can be used. A microcomputer can be a small chip, so that when it is placed in a small information terminal, the weight and the size are not much increased; thus, highly accurate anomaly detection can be achieved. Note that a microcomputer includes a CPU (Central Processing Unit), a ROM (Read Only Memory), a RAM (Random Access Memory), and the like. The number of bits that the CPU of the microcomputer can process in an internal arithmetic circuit or in a data bus can be 8, 16, 32, or 64, for example.

In this specification, a neural network refers to a general model that is modeled on a biological neural network, determines the connection strength of neurons by learning, and has the capability of solving problems. A neural network includes an input layer, an intermediate layer (also referred to as a hidden layer), and an output layer.

In describing a neural network in this specification, to determine a connection strength (also referred to as a weight coefficient) of neurons from existing information is sometimes referred to as learning.

Moreover, in this specification, to draw a new conclusion from a neural network formed using a connection strength obtained by learning is sometimes referred to as inference.

Effect of the Invention

According to one embodiment of the present invention, a state of a storage battery (cell state) can be determined. According to one embodiment of the present invention, the performance of a storage battery can be predicted. According to one embodiment of the present invention, a highly safe storage battery can be provided. According to one embodiment of the present invention, an electronic device having a power storage system with excellent characteristics can be provided. According to one embodiment of the present invention, a vehicle having a power storage system with excellent characteristics can be provided. According to one embodiment of the present invention, a novel semiconductor device can be provided.

Note that the descriptions of the effects do not disturb the existence of other effects. Note that one embodiment of the present invention does not have to have all of these effects. Other effects will be apparent from and can be derived from the description of the specification, the drawings, the claims, and the like.

MODE FOR CARRYING OUT THE INVENTION

Figure 1A:
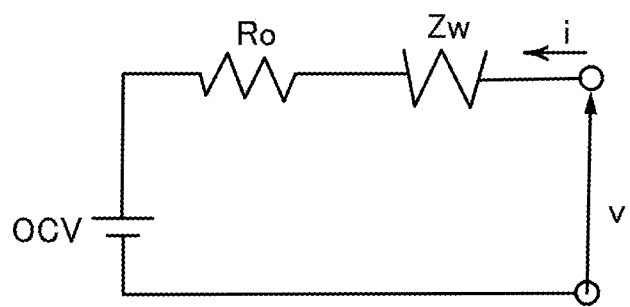
FIG. 1 (A) A diagram illustrating a battery model. (B) A block diagram illustrating a battery.

Hereinafter, embodiments of the present invention will be described in detail with reference to drawings. Note that the present invention is not limited to the description below, and it is easily understood by those skilled in the art that modes and details of the present invention can be modified in various ways. In addition, the present invention should not be construed as being limited to the description in the embodiments given below.

Embodiment 1

This embodiment discloses an anomaly detection system based on the internal resistance or the remaining capacity of a lithium-ion battery. The internal resistance or the remaining capacity of a lithium-ion battery is estimated with the nonlinear Kalman filter. A method of estimating a state with the unscented Kalman filter (also referred to as UKF), which is a type of the nonlinear Kalman filters, is explained using a battery model shown in FIG. 1(A) in this embodiment. The battery model is composed of two components: an open circuit voltage (OCV) and an internal impedance of a storage battery.

The OCV can be calculated through measuring the voltage after charging or discharging was stopped, predetermined period of time passed, and the reaction in the battery becomes stable, for example. It needs to stop charging or discharging and to wait for a predetermined time until the reaction in the battery becomes stable; thus, it may take a long time to measure the OCV. The predetermined time is, for example, the time after 2 minutes and less than or equal to 5 hours, or after 5 minutes and less than or equal to 2 hours.

Since it may take a long time for OCV measurement, an alternative measurement may be performed with a shortened time for waiting after charging or discharging (hereinafter referred to as resting time) was stopped.

As the above alternative measurement, the voltage change may be measured to estimate the OCV through changing the current value of charging or discharging.

The equation of state below represents a discreet-time nonlinear system.

$$x(k+1)=f(x(k),\theta(k),u(k))+v(k) \quad \text{[Equation 1]}$$

The following represents the output equation.

$$y(k)=h(x(k),\theta(k),u(k))+w(k) \quad \text{[Equation 2]}$$

Note that v is a normal white noise following N(0, Q) and w is a normal white noise following N(0, R). A current and a voltage of a secondary battery is shown by u(k) and y(k), respectively.

Though an unknown parameter θ estimated by a simultaneous estimation method has a constant value, it has a random value with normal distribution by a system noise n. That is, the following equation is given.

$$\theta(k+1)=\theta(k)+n(k) \quad \text{[Equation 3]}$$

Note that n is a normal white noise following N(0, $Q_\theta$).

The unknown parameter θ is added to a state variable x, and the extended state variable is defined by the following equation.

$$z(k)=[x^T(k)\theta^T(k)]^T \quad \text{[Equation 4]}$$

The above equation can be rewritten as the following extended system.

$$z(k+1) = f(z(k), u(k)) + \begin{bmatrix} v(k) \\ n(k) \end{bmatrix} \quad \text{[Equation 5]}$$

The output equation is represented as the following equation.

$$y(k)=h(z(k),u(k))+w(k) \quad \text{[Equation 6]}$$

When the nonlinear Kalman filter is used for the above-extended system, a state and an unknown parameter can be simultaneously estimated.

Next, a procedure for simultaneous estimation with the nonlinear Kalman filter is shown below. The battery model illustrated in FIG. 1(A) is used. Note that Zw (Warburg impedance) shown in FIG. 1(A) is represented by a Foster equivalent circuit with three variables. The model shown in FIG. 1(A) includes four unknown parameters; however, it is assumed here that only the series resistance $R_0$ is an unknown parameter and the other three parameters are known parameters for simplicity. The state equation is represented by the following equation if the extended system is rewritten.

$$\frac{d}{dt}z(n) = \begin{bmatrix} 0 & 0 & 0 & 0 & 0 \\ 0 & -1/R_1C_1 & 0 & 0 & 0 \\ 0 & 0 & -1/R_2C_2 & 0 & 0 \\ 0 & 0 & 0 & -1/R_3C_3 & 0 \\ 0 & 0 & 0 & 0 & 0 \end{bmatrix} \quad \text{[Equation 7]}$$

$$z(t) + \begin{bmatrix} 1/FCC \\ 1/C_1 \\ 1/C_2 \\ 1/C_3 \\ 0 \end{bmatrix} u(t)$$

The following represents the output equation.

$$y(t) = f_{ocv}(SOC(t)) + [0\ 1\ 1\ 1\ 0]z(t) + R_0(t)u(t) \quad \text{[Equation 8]}$$

$$f_{ocv}(SOC(t)) = E^\circ + K_1 \ln(SOC(t)) +$$
$$k_2\ln(1 - SOC(t)) - \frac{k_3}{SOC(t)} - k_4 SOC(t)$$

$f_{ocv}(.)$ is a nonlinear function representing SOC-OCV.

Note that the state variable z of this extended state is described as shown below.

$$z(t)=[SOC(t)v_1(t)v_2(t)v_3(t)R_0(t)]^T \quad \text{[Equation 9]}$$

Next, a specific numerical simulation is performed. Parameters required for the simulation such as input and output data and an observation noise are set as follows.

$$Q=\text{diag}((0.1\%)^2 10^{-6} 10^{-6} 10^{-6} 10^{-20})$$

$$r=0.01^2$$

$$\hat{z}(0)=[91.41\%\ 0\ 0\ 0\ 0.9\times10^{-3}]^T$$

$$P(0)=\text{diag}((10\%)^2 10^{-4} 10^{-4} 10^{-4} 10^{-4}) \quad \text{[Equation 10]}$$

Figure 1B:
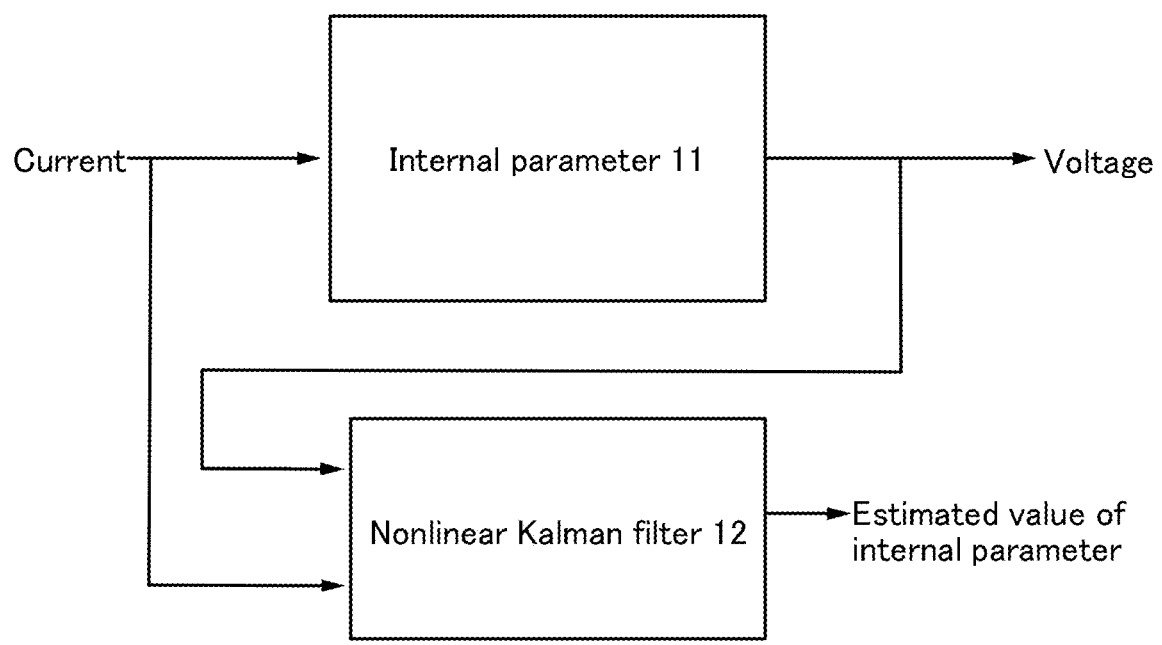

The SOC and the series resistance $R_0$ can be obtained through simultaneous estimation using UKF under the above-described conditions. FIG. 1(B) is a block diagram. An internal parameter 11 and a nonlinear Kalman filter 12 are shown in FIG. 1. An estimated value of the internal parameters include the values of the SOC and the series resistance $R_0$.

Data of the obtained SOC and series resistance $R_0$ are input to the neural network as parameters of the secondary battery. Then, arithmetic processing is performed in each layer and the data after a predetermined time is predicted.

If the difference between the predicted internal resistance, which is the series resistance $R_0$ here, and the estimated internal resistance is large, it can be regarded as an anomaly. When the difference between the past value predicted by the neural network and the present value estimated by the nonlinear Kalman filter is small, it can be regarded as normal.

As the neural network, an architecture called LSTM (Long Short-Term Memory) can be used. In the LSTM, an estimation program is prepared with an adder (Add), a sigmoid function (sigmoid), tanh, Hadamard product, and the like which are set properly, in addition to multiplyaccumulate operation (MAC). A variety of programing languages such as Python, Go, Perl, Ruby, Prelog, Visual Basic, C, C++, Swift, Java (registered trademark), and .NET can be used for the program of the software executing an estimation program. The application may be designed using a framework such as Chainer (it can be used with Python), Caffe (it can be used with Python and C++), and TensorFlow (it can be used with C, C++, and Python). An IC with an AI system (also referred to as an estimation chip) can be used. An IC with an AI system is referred to as a circuit performing a neural network calculation (also referred to as a microcomputer) in some cases.

Figure 2:
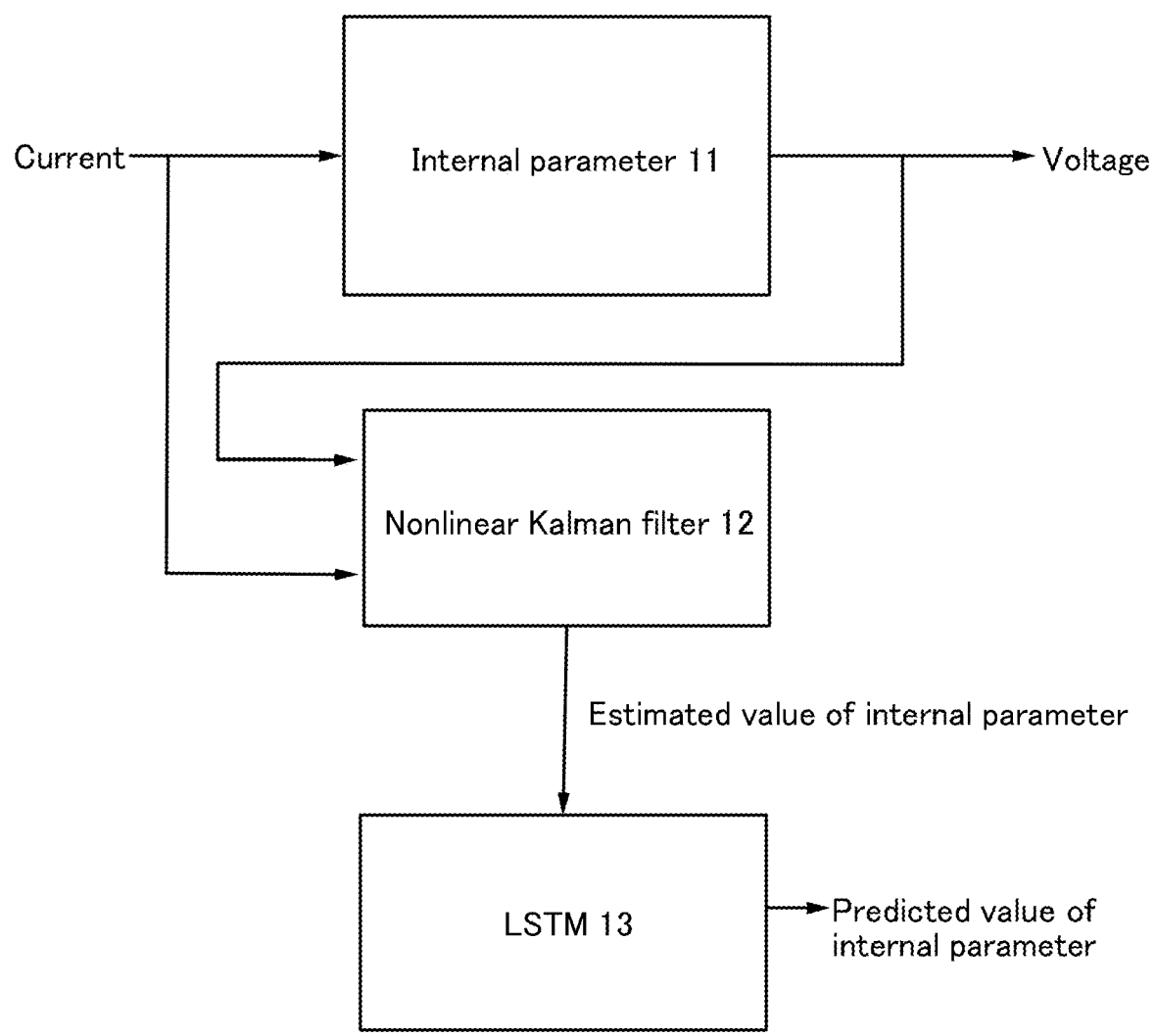
FIG. 2 A block diagram illustrating a capacity estimation system of one embodiment of the present invention.
Figure 3:
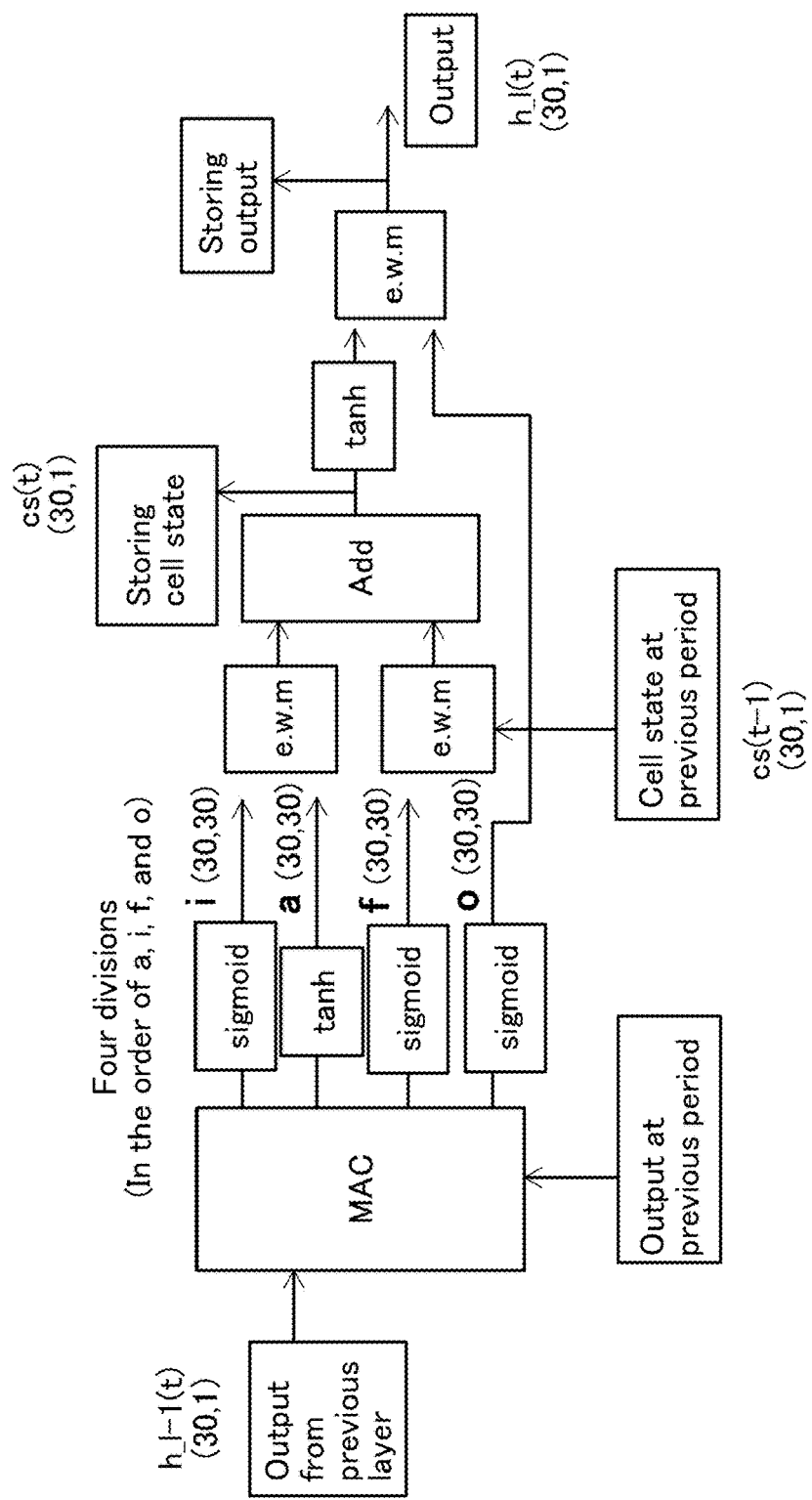
FIG. 3 A diagram illustrating an algorithm of LSTM.

FIG. 2 is a block diagram of one embodiment of the present invention using a neural network. FIG. 2 shows the internal parameter 11, the nonlinear Kalman filter 12, and an LSTM 13. FIG. 3 shows an example of an algorithm of the LSTM. For example, when the difference between the estimated value of the internal resistance output from the nonlinear Kalman filter 12 and the predicted value of the internal resistance output from the LSTM 13 is large at a point in time, it can be regarded as an anomaly. Note that the neural network includes the LSTM 13. The predicted value of the internal parameter includes the values of the SOC and the series resistance $R_0$ after a predetermined time. When data obtained through repeating charging and discharging of a secondary battery is learned, an anomaly of the internal resistance can be detected more easily than other internal parameters when the anomaly occurs because the internal resistance has comparably small and moderate change in the value over time. Note that change in the internal resistance can be large when CC charging is switched to CV charging in the CCCV charging. Thus, the change in the internal resistance in the period is learned, and the predicted value and the estimated value of the internal resistance are preferably compared regardless of the period. CCCV charging is a charging method in which CC charging is performed first until the voltage reaches a predetermined voltage and then CV (constant voltage) charging is performed until the amount of current flow becomes small, specifically, a termination current value. Note that CC charging is a charging method in which a constant current is made to flow to a secondary battery in the whole charging period and charging is stopped when the voltage reaches a predetermined voltage.

According to a power storage system of one embodiment of the present invention using a neural network, the SOC of a storage battery may be measured or estimated. The SOC means the percentage of the capacity of a storage battery when the full charge capacity (FCC) is 100%. SOC is also referred to as a battery percentage. The FCC is discharge capacity of a storage battery when it discharges after it is fully charged. The full charge means that charging is performed to the full in a storage battery under a predetermined condition. The FCC varies due to end-of-charge voltage (maximum charge voltage), end-of-charge current, and others.

It is preferable that an anomalous state of a storage battery such as major change in the internal resistance be detected and determined as an anomaly by the neural network of one embodiment of the present invention. After anomaly determination, a caution or the like is notified to a user. Moreover, the lifetime of a storage battery may be predicted from the data based on the SOC using the nonlinear Kalman filter.

In the power storage system of one embodiment of the present invention, learning can be performed by giving parameters such as OCV, SOC, internal resistance, and FCC to the neural network of the power storage system, for example. Data for learning is obtained beforehand from a battery which is made by the same manufacturing apparatus for the battery which is a target of anomaly determination. Here, it is preferable that parameters given to the neural network be parameters over time of a storage battery. For example, a change in a parameter which is caused by charging and discharging of the storage battery is given to the neural network. For example, a change between parameters before and after storing the storage battery is given to the neural network. Storing a storage battery also means the case of storing it for a time under a predetermined temperature with a predetermined SOC.

Embodiment 2

In this embodiment, an example of a structure applicable to the power storage system of one embodiment of the present invention will be described.

Cylindrical Secondary Battery

Figure 4A:
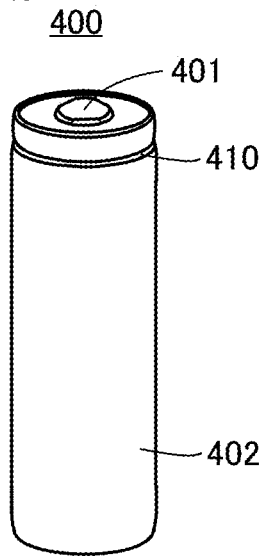
FIG. 4 Diagrams illustrating a cylindrical secondary battery.

An example of a cylindrical secondary battery will be described with reference to FIG. 4(A). A cylindrical secondary battery 400 includes, as illustrated in FIG. 4(A), a positive electrode cap (battery lid) 401 on the top surface and a battery can (outer can) 402 on the side surface and the bottom surface. The positive electrode cap 401 and the battery can (outer can) 402 are insulated from each other by a gasket (insulating packing) 410.

Figure 4B:
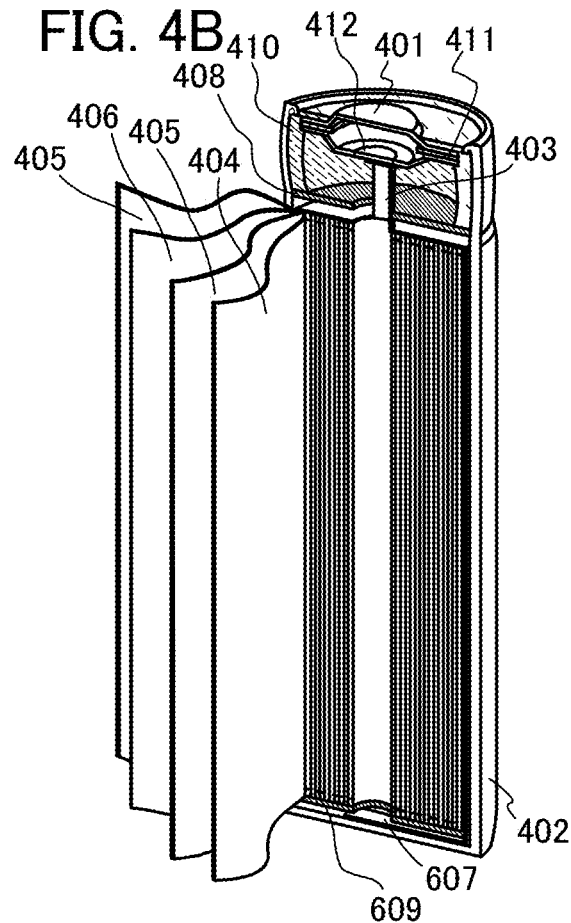

FIG. 4(B) is a schematic cross-sectional view of the cylindrical secondary battery. Inside the battery can 402 having a hollow cylindrical shape, a battery element in which a strip-like positive electrode 404 and a strip-like negative electrode 406 are wound with a separator 405 located therebetween is provided. Although not illustrated, the battery element is wound around a center pin. One end of the battery can 402 is closed and the other end thereof is an open end. For the battery can 402, a metal having a corrosion-resistant property to an electrolyte solution, such as nickel, aluminum, or titanium, an alloy of such a metal, or an alloy of such a metal and another metal (e.g., stainless steel) can be used. The battery can 402 is preferably covered with nickel, aluminum, or the like to prevent corrosion due to the electrolyte solution. Inside the battery can 402, the battery element in which the positive electrode, the negative electrode, and the separator are wound is provided between a pair of insulating plates 408 and 409 that face each other. Furthermore, a nonaqueous electrolyte solution (not illustrated) is injected inside the battery can 402 provided with the battery element. The secondary battery is formed of a positive electrode containing an active material such as lithium cobalt oxide ($LiC_OO_2$) or lithium iron phosphate ($LiFePO_4$), a negative electrode composed of a carbon material such as graphite capable of occluding and releasing lithium ions, a nonaqueous electrolytic solution in which an electrolyte composed of a lithium salt such as $LiBF_4$ or $LiPF_6$ is dissolved in an organic solvent such as ethylene carbonate or diethyl carbonate, and the like.

Since the positive electrode and the negative electrode of the cylindrical storage battery are wound, active materials are preferably formed on both sides of the current collectors. A positive electrode terminal (positive electrode current collecting lead) 403 is connected to the positive electrode 404, and a negative electrode terminal (negative electrode current collecting lead) 407 is connected to the negative electrode 406. Both the positive electrode terminal 403 and the negative electrode terminal 407 can be formed using a metal material such as aluminum. The positive electrode terminal 403 and the negative electrode terminal 407 are resistance-welded to a safety valve mechanism 412 and the bottom of the battery can 402, respectively. The safety valve mechanism 412 is electrically connected to the positive electrode cap 401 through a PTC (Positive temperature coefficient) element 411. The safety valve mechanism 412 cuts off electrical connection between the positive electrode cap 401 and the positive electrode 404 when the internal pressure of the battery exceeds a predetermined threshold value. The PTC element 411, which serves as a thermally sensitive resistor whose resistance increases as temperature rises, limits the amount of current by increasing the resistance, in order to prevent abnormal heat generation. Barium titanate ($BaTiO_3$)-based semiconductor ceramic or the like can be used for the PTC element.

FIG. 4(B) shows an example of a power storage system 415. The power storage system 415 includes a plurality of secondary batteries 400. A positive electrode of each secondary battery is in contact with and electrically connected to a conductor 424 separated by an insulator 425. The conductor 424 is electrically connected to the anomaly detection system 420 through a wiring 423. A negative electrode of each secondary battery is electrically connected to the anomaly detection system 420 through a wiring 426. The anomaly detection system described in the above embodiment can be used as the anomaly detection system 420.

Figure 4C:
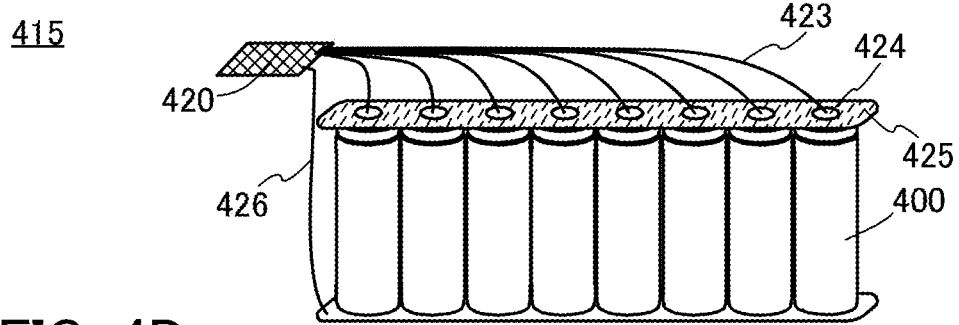

FIG. 4(C) shows an example of the power storage system 415. The power storage system 415 includes a plurality of secondary batteries 400, and the plurality of secondary batteries 400 are interposed between a conductive plate 413 and a conductive plate 414. The plurality of secondary batteries 400 are electrically connected to the conductive plate 413 and the conductive plate 414 through a wire 416. The plurality of secondary batteries 400 may be connected in a parallel way, connected in series, or connected in series after being connected in a parallel way. With the power storage system 415 including the plurality of secondary batteries 400, large electric power can be extracted. For example, the power storage system 415 can be used as a power storage system for driving an electric vehicle.

A temperature control device may be provided between the plurality of secondary batteries 400. When the secondary batteries 400 are overheated, the temperature control device can cool them, and when the secondary batteries 400 are cooled too much, the temperature control device can heat them. Thus, the performance of the power storage system 415 is not easily affected by the outside temperature.

Figure 4D:
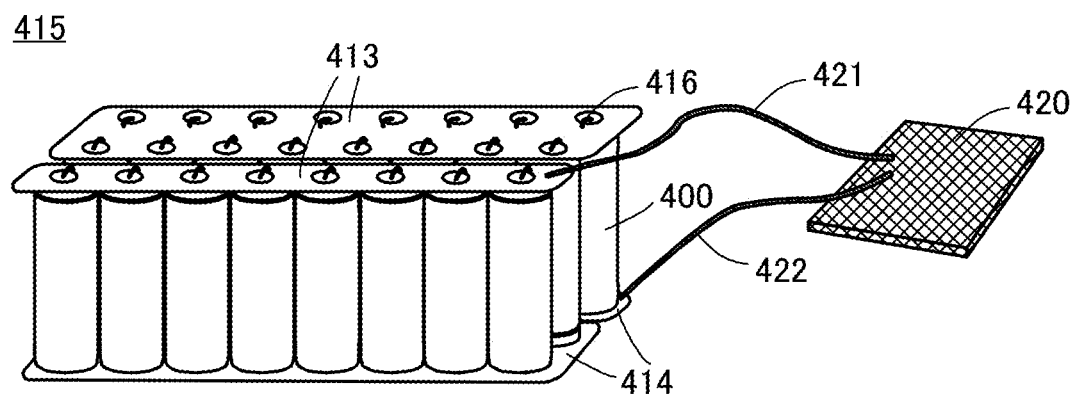

In FIG. 4(D), the power storage system 415 is electrically connected to the anomaly detection system 420 through a wiring 421 and a wiring 422. The anomaly detection system described in the above embodiment can be used as the anomaly detection system 420. The wiring 421 and the wiring 422 are electrically connected to the positive electrodes of the plurality of the secondary batteries 400 through the conductive plate 413 and the negative electrodes of the plurality of the secondary batteries 400 through the conductive plate 414, respectively.

Secondary Battery Pack

Next, an example of a power storage system of one embodiment of the present invention is described with reference to FIG. 5.

Figure 5A:
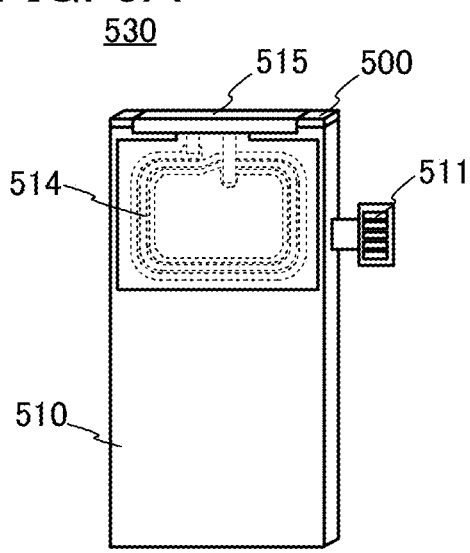
FIG. 5 Examples of a structure of a storage battery.
Figure 5B:
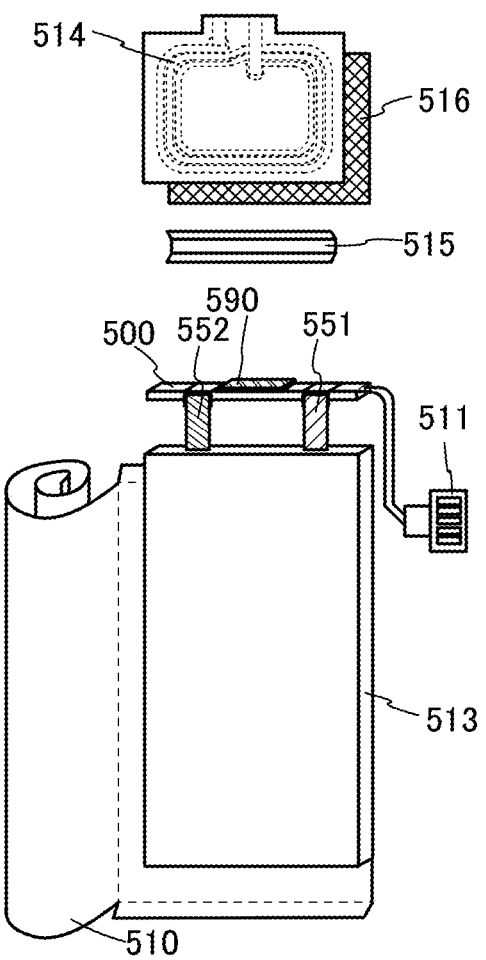

FIG. 5(A) is an external view of a secondary battery pack 530. FIG. 5(B) is a diagram illustrating a structure of the secondary battery pack 530. The secondary battery pack 530 includes a circuit board 500 and a secondary battery 513. A label 510 is attached onto the secondary battery 513. The circuit board 500 is fixed by a sealant 515. The secondary battery pack 530 includes an antenna 514.

The circuit board 500 includes a control system 590. The control system 590 includes the anomaly detection system described in the above embodiment. For example, as shown in FIG. 5(B), the control system 590 is provided on the circuit board 500. The circuit board 500 is electrically connected to a terminal 511. The circuit board 500 is electrically connected to the antenna 514, a positive or negative electrode lead 551 of the secondary battery 513, and a positive or negative electrode lead 552 of the secondary battery 513.

Figure 5C:
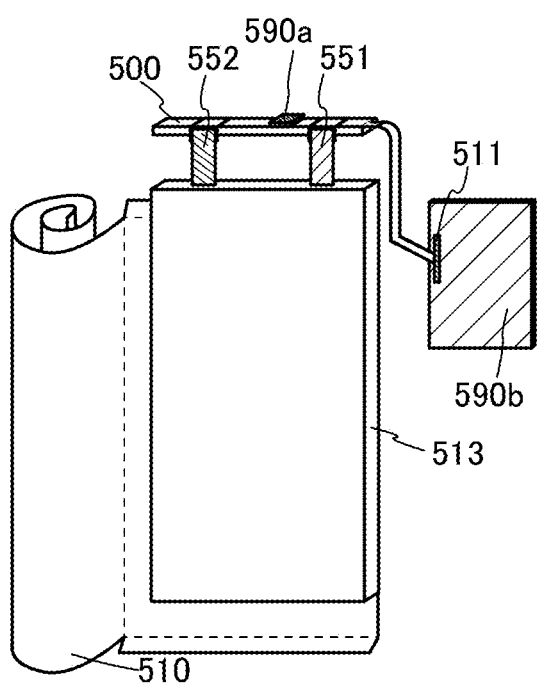

Alternatively, a circuit system 590a provided on the circuit board 500 and a circuit system 590b electrically connected to the circuit board 500 through the terminal 511 may be provided as illustrated in FIG. 5(C). Note that the circuit system 590a can be one IC chip, and the circuit system 590b can also be one IC chip. For example, a protection circuit and a charge control circuit are provided in the circuit system 590a, and part of the anomaly detection system of one embodiment of the present invention is provided in the circuit control system 590b.

For example, an IC chip executing operations using the nonlinear Kalman filter described in Embodiment 1 and an IC chip executing operations using LSTM can be in the same chip. Algorithms of the nonlinear Kalman filter and the LSTM can be programmed with Python; thus, the same CPU or GPU (Graphics Processing Unit) can be used, which is an advantage. The use of the same chip can reduce the cost. Furthermore, a chip in which a CPU and a GPU are integrated is sometimes called APU (Accelerated Processing Unit), and this APU chip can also be used.

Note that the shape of the antenna 514 is not limited to a coil shape and may be a linear shape or a plate shape. Further, a planar antenna, an aperture antenna, a traveling-wave antenna, an EH antenna, a magnetic-field antenna, or a dielectric antenna may be used. Alternatively, the antenna 514 may be a flat-plate conductor. The flat-plate conductor can serve as one of conductors for electric field coupling. That is, the antenna 514 may serve as one of two conductors of a condenser. Thus, electric power can be transmitted and received not only by an electromagnetic field or a magnetic field but also by an electric field.

The secondary battery pack 530 includes a layer 516 between the secondary battery 513 and the antenna 514. The layer 516 has a function of, for example, screening out an electromagnetic field from the secondary battery 513. As the layer 516, for example, a magnetic body can be used.

The secondary battery 513 includes a wound battery element. The battery element includes a negative electrode, a positive electrode, and a separator. The battery element is obtained through winding a sheet of a stack in which the negative electrode overlaps with the positive electrode with the separator interposed therebetween.

This embodiment can be combined with the description of the other embodiments as appropriate.

Embodiment 3

In this embodiment, an example of providing the anomaly detection system of one embodiment of the present invention for vehicles is shown. Examples of vehicles include an automobile, a motorcycle, and a bicycle.

By providing the power storage system on vehicles, next-generation clean energy vehicles such as hybrid electric vehicles (HEV), electric vehicles (EV), or plug-in hybrid electric vehicles (PHEV) can be obtained.

Figure 6A:
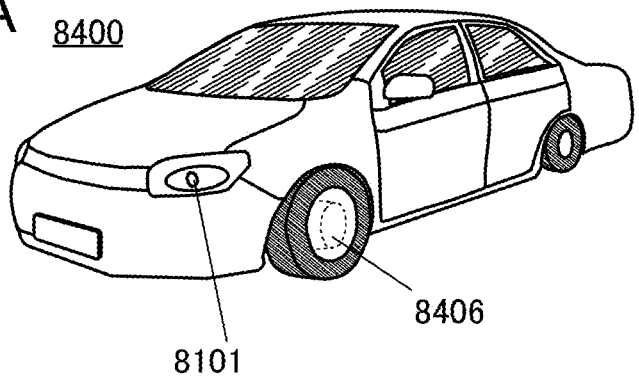
FIG. 6 Examples of vehicles.

FIG. 6 shows examples of vehicles using the power storage system of one embodiment of the present invention. An automobile 8400 shown in FIG. 6(A) is an electric vehicle that runs on an electric motor as a power source. Alternatively, the automobile 8400 is a hybrid vehicle capable of driving appropriately using either an electric motor or an engine. The use of one embodiment of the present invention can detect anomalies of the secondary battery before it becomes unusable and the vehicle becomes undriveable when the anomalies occur in the secondary battery of the vehicle; thus, a caution can be notified to a user at an early stage, so that the user's safety can be provided. The automobile 8400 includes the power storage system having a secondary battery. The power storage system includes the anomaly detection system described in Embodiment 1. The power storage system is used not only for driving an electric motor 8406, but also for supplying electric power to a light-emitting device such as a headlight 8101 or a room light (not illustrated). An independent secondary battery which is separated from the one for driving is preferably provided to avoid a case where electric power supply is stopped and hazard lights does not work due to anomalies of the secondary battery.

The power storage system can also supply electric power to a display device of a speedometer, a tachometer, or the like included in the automobile 8400. Furthermore, the power storage system can supply electric power to a navigation system or the like included in the automobile 8400.

Figure 6B:
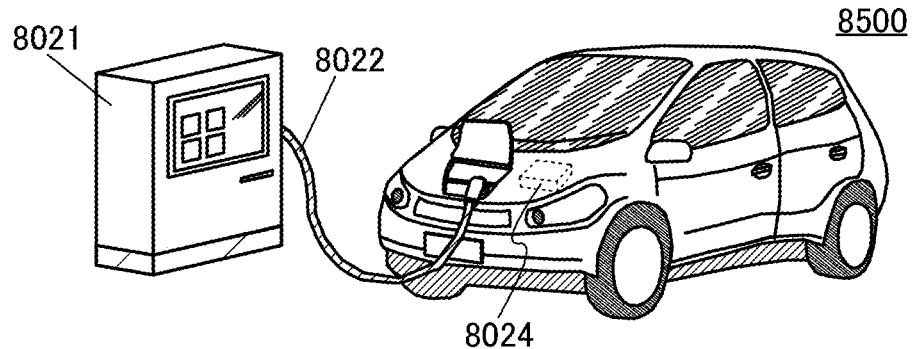

An automobile 8500 illustrated in FIG. 6(B) can charge the storage battery system included in the automobile 8500 through an electric power supply from an external charging equipment using a plug-in system, a contactless power feeding system, or the like. FIG. 6(B) shows the state where a power storage system 8024 included in the automobile 8500 is charged with a ground-based charging device 8021 through a cable 8022. In charging, a given method such as CHAdeMO (registered trademark) or Combined Charging System may be employed as a charging method, the standard of a connector, or the like as appropriate. The charging device 8021 may be an EV charger provided at a commerce facility or a power source at a house. For example, with the use of a plug-in technique, the power storage system 8024 included in the automobile 8500 can be charged through an electric power supply from the outside. Charging can be performed through converting AC electric power into DC electric power using a converter such as an AC-DC converter. The power storage system 8024 includes the anomaly detection system described in Embodiment 1. The anomaly detection system described in Embodiment 1 can detect an anomaly before the secondary battery becomes unusable and the vehicle becomes undriveable when the anomaly occurs in the secondary battery of the automobile 8500; thus, the user's safety can be provided.

Furthermore, although not illustrated, the vehicle may include a power-receiving device so that it can be charged through a contactless electric power supply from an above-ground electric charger in a contactless manner. In the case of this contactless charging system, provision of an electric charger in a road or an exterior wall enables charging not only when the electric vehicle is stopped but also when driven. In addition, the contactless charging system may be utilized to perform transmission and reception of electric power between vehicles. Furthermore, a solar cell may be provided in the exterior of the vehicle to charge the power storage system when the vehicle stops or moves. To supply electric power in such a contactless manner, an electromagnetic induction method or a magnetic resonance method can be used.

Figure 6C:
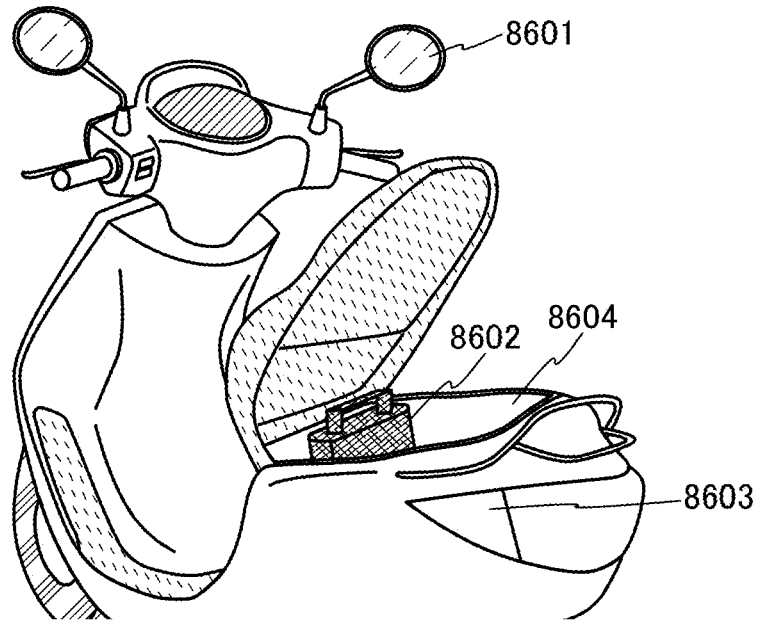

FIG. 6(C) shows an example of a motorcycle using the anomaly detection system of one embodiment of the present invention. A scooter 8600 shown in FIG. 6(C) is equipped with a power storage system 8602, side mirrors 8601, and direction indicators 8603. The power storage system 8602 can supply electric power to the direction indicators 8603. The power storage system 8602 includes the anomaly detection system described in Embodiment 1. The anomaly detection system described in Embodiment 1 can detect an anomaly before the secondary battery becomes unusable and the scooter 8600 becomes undriveable when the anomaly occurs in the secondary battery of the scooter 8600; thus, the user's safety can be provided.

Furthermore, an under seat storage 8604 of the scooter 8600 shown in FIG. 6(C) can store the power storage system 8602. The power storage system 8602 can be stored in the under seat storage 8604 even though the under seat storage 8604 is small.

This embodiment can be combined with the description of the other embodiments as appropriate.

REFERENCE NUMERALS

11: internal parameter, 12: nonlinear Kalman filter, 13: LSTM, 400: secondary battery, 401: positive electrode cap, 402: battery can, 403: positive electrode terminal, 404: positive electrode, 406: negative electrode, 407: negative electrode terminal, 411: PTC element, 412: safety valve mechanism, 415: power storage system, 510: label, 511: terminal: 513: secondary battery, 514: antenna, 515: sealant, 516: layer, 530: secondary battery pack, 8024: power storage system, 8101: headlight, 8400: automobile, 8406: electric motor, 8500: automobile, 8600: scooter, 8601: side mirror, 8602: power storage system, 8603: direction indicator, 8604: under seat storage

The invention claimed is:
1. An anomaly detection system for a secondary battery comprising:
a neural network comprising LSTM;
a secondary battery;
a detection method for detecting current of the secondary battery; and
a detection method for detecting voltage of the secondary battery,
wherein the neural network comprises an input layer, an output layer, and one or a plurality of hidden layers interposed between the input layer and the output layer,
wherein the neural network is configured to output a value of a tanh function as at least one of the one or the plurality of hidden layers,
wherein an estimated value of an internal parameter is calculated using data of the current and the voltage with a nonlinear Kalman filter,
wherein the estimated value of the internal parameter is input to the neural network,
wherein the neural network outputs a future predicted value of the internal parameter, and
wherein a past predicted value of the internal parameter and a present estimated value of the internal parameter are compared and a case where a difference is large is regarded as an anomaly of the secondary battery.

2. The anomaly detection system for a secondary battery according to claim 1, wherein the nonlinear Kalman filter is an unscented Kalman filter.

3. The anomaly detection system for a secondary battery according to claim 1, wherein the secondary battery is a lithium-ion secondary battery.

* * * * *